(12) United States Patent
Sasaki et al.

(10) Patent No.: US 8,597,536 B2
(45) Date of Patent: Dec. 3, 2013

(54) PEROVSKITE OXIDE, OXIDE COMPOSITION, OXIDE BODY, PIEZOELECTRIC DEVICE, AND LIQUID DISCHARGE APPARATUS

(75) Inventors: Tsutomu Sasaki, Kanagawa-ken (JP); Yukio Sakashita, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 146 days.

(21) Appl. No.: 13/116,646

(22) Filed: May 26, 2011

(65) Prior Publication Data

US 2011/0292133 A1   Dec. 1, 2011

(30) Foreign Application Priority Data

May 27, 2010   (JP) ................................. 2010-121644

(51) Int. Cl.
*H01L 41/00* (2013.01)
(52) U.S. Cl.
USPC ............ 252/62.9 R; 252/62.9 PZ; 423/594.2; 501/126; 501/134; 501/135
(58) Field of Classification Search
USPC ........ 252/62.9 R, 62.9 PZ; 423/594.1, 594.2; 501/126–135; 347/68; 310/311, 364
See application file for complete search history.

(56) References Cited

U.S. PATENT DOCUMENTS

| 7,586,234 | B2 | 9/2009 | Miyazawa et al. | |
|---|---|---|---|---|
| 2006/0279178 | A1 | 12/2006 | Ren | |
| 2009/0230211 | A1* | 9/2009 | Kobayashi et al. | 239/102.2 |
| 2009/0243438 | A1 | 10/2009 | Hamada et al. | |
| 2009/0267998 | A1 | 10/2009 | Sakashita et al. | |
| 2011/0006243 | A1* | 1/2011 | Sasaki et al. | 252/62.9 PZ |
| 2011/0217454 | A1* | 9/2011 | Hamada | 427/100 |

FOREIGN PATENT DOCUMENTS

| JP | 2000-326506 A | 11/2000 |
|---|---|---|
| JP | 3568107 B2 | 9/2004 |
| JP | 2004-363557 A | 12/2004 |
| JP | 2007-116091 A | 5/2007 |

OTHER PUBLICATIONS

Park et al., "Ultrahigh strain and piezoelectric behavior in relaxor based ferroelectric single crystals", J. Appl. Phys, 82 (4) , Aug. 15, 1997, pp. 1804-1811.
Rai et al., "Ferroelectric and ferromagnetic properties of Gd-doped BiFeO3-BaTiO3 solid solution", Materials Chemistry and Physics, 119, 2010, pp. 539-545.

* cited by examiner

*Primary Examiner* — Steven Bos
(74) *Attorney, Agent, or Firm* — Birch, Stewart, Kolasch & Birch, LLP

(57) ABSTRACT

Disclosed is a non-lead perovskite oxide having a low Curie temperature and high ferroelectricity represented by General Formula (P) given below.

$$(Bi_{x1}, Ba_{x2}, X_{x3})(Fe_{y1}, Ti_{y2}, Mn_{y3})O_3 \quad (P)$$

(where, Bi and Ba are A-site elements, X is one kind or a plurality of kinds of A-site elements, other than Pb and Ba, with an average ion valence of 2. Fe, Ti, and Mn are B-site elements. O is oxygen. $0 < x1+X2 < 1.0$, $0 < x3 < 1.0$, $0 < y1+y2 < 1.0$, $0 \leq y3 < 1.0$, $0 < x1$, $0 < x2$, $0 < y1$, $0 < y2$. The standard molar ratios among A-site elements, B-site elements, and oxygen are 1:1:3, but the molar ratios among them may deviate from the standard ratios within a range in which a perovskite structure may be formed.)

6 Claims, 6 Drawing Sheets

PEROVSKITE OXIDE, OXIDE COMPOSITION, OXIDE BODY, PIEZOELECTRIC DEVICE, AND LIQUID DISCHARGE APPARATUS

BACKGROUND OF THE INVENTION

1. Field of the Invention

The present invention relates to a bismuth ferrite perovskite oxide and an oxide composition/oxide body/piezoelectric device/liquid discharge apparatus using the same.

2. Description of the Related Art

Perovskite oxides having ferroelectricity are used in various applications, such as piezoelectric devices, switching devices, and the like. For example, as a perovskite oxide having excellent piezoelectric properties, lead zirconate titanate (PZT) is known. PZT is a ferroelectric body having spontaneous polarization in the absence of electric field, and said to show high piezoelectricity at and near a morphotropic phase boundary (MPB). If environmental burden is considered, it is preferable that Pb content is reduced as much as possible and a non-lead system that does not include Pb is more preferable. In non-lead perovskite oxides, development of new materials having high piezoelectricity has been in progress.

As a non-lead perovskite oxide having high piezoelectricity (ferroelectricity) in theory, Bi perovskite oxides have been under study. Most of the Bi perovskite oxides, however, hardly, and some of them can not, take a perovskite structure by high-temperature sintering under normal pressure.

Currently, $BiFeO_3$ is the only Bi perovskite oxide, in bulk ceramics, that can be manufactured into a Bi perovskite oxide under normal pressure. Thus, $BiFeO_3$ can also be easily made into a Bi perovskite oxide in thin films. As having a high Curie temperature and a large spontaneous polarization, $BiFeO_3$ has been studied as a prospective material of dielectric memories and piezoelectric actuators. But, $BiFeO_3$ has a low dielectric constant and a high coercive electric field Ec in addition to leakage, so that a high piezoelectric constant can not be expected from $BiFeO_3$ alone.

Consequently, a perovskite oxide film made of a material provided by solid solving $BiFeO_3$ into barium titanate ($BaTiO_3$), which is known as a non-lead perovskite oxide, is disclosed in U.S. Pat. No. 7,586,234 (Patent Document 1). The $BiFeO_3$—$BaTiO_3$ (BF—BT) perovskite oxide, however, has a problem that leakage current is likely to occur due to Fe valence change in $BiFeO_3$.

In order to improve leakage characteristics, a technique for adding Mn in B-site of a BF—BT perovskite oxide is reported as described, for example, in U.S. Patent Application Publication No. 2009243438 (Patent Document 2). Patent Document 2 discloses a perovskite oxide film made of a material provided by adding and solid solving Mn to B-site of $BiFeO_3$ and Zr to B-site of $BaTiO_3$.

Figure 10:
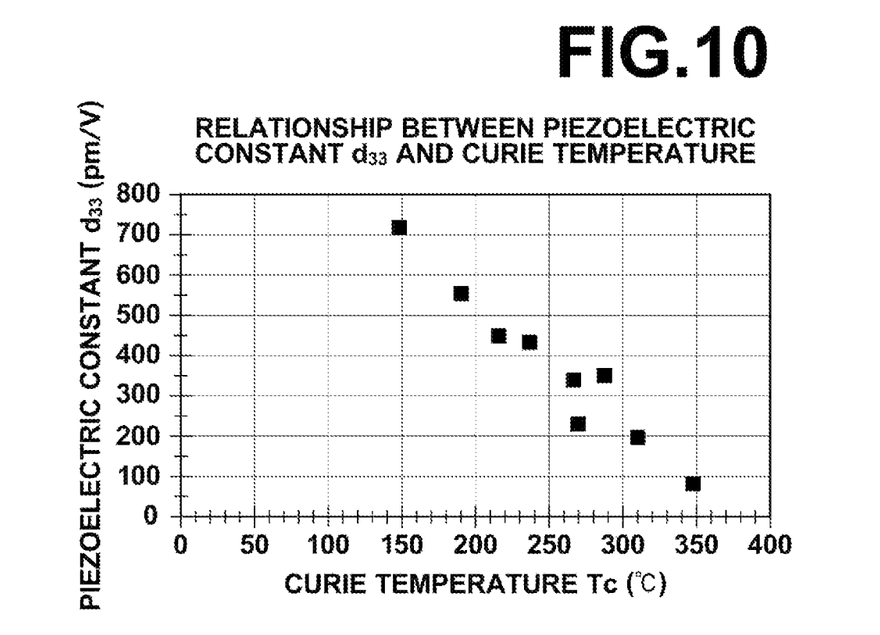
FIG. 10 illustrates the relationship between Curie temperature and piezoelectric constant d.

In the mean time, the $BiFeO_3$—$BaTiO_3$ (BF—BT) perovskite oxide has relatively high piezoelectricity among non-lead systems, but it has, for example, in a thin film state, a problem of low piezoelectricity under a low electric field of not greater than 30 V/1 μmt in comparison with a lead system. One of the factors for this would be a high Curie temperature of the BF—BT system. It is known that, as illustrated in FIG. 10, there is a correlation between the Curie temperature and piezoelectric d constant, and the BF—BT system has a Curie temperature of about 500° C. or higher. Consequently, attempts have been made to improve piezoelectric properties of the BF—BT system by decreasing the Curie temperature.

Patent Document 2 describes that a pinching effect is obtained by the addition of Zr. The "pinching effect" as used herein refers to the effect in which phase transition points of a compound, such as $BaTiO_3$, having may phase transition points in a wide temperature range are collected to around a convenient temperature by solid solving, for example, $BaSnO_3$ into $BaTiO_3$ to reduce the variation with temperature in relative dielectric constant and to obtain a larger relative dielectric constant.

A literature by Rai et al., Material Chemistry and Physics, 119 (2010), pp 539-545 (Non-patent Document 1) discloses a Gd doped $BiFeO_3$—$BaTiO_3$ perovskite oxide in which the Curie temperature becomes 150° C. to 170° C.

For the Curie temperature of the BF—BT perovskite oxide, no phase transition temperature is observed from the liquid nitrogen temperature to 500° C., so that in Patent Document 2, it would be quite unlikely that the pinching effect in which phase transition temperatures of a crystal in a wide temperature range are collected to around a convenient temperature is applicable and the piezoelectric properties are rather degraded by the addition of Zr.

In the perovskite oxide of Non-patent Document 1, the Curie temperature is decreased to as low as 150 to 170° C. Although Non-patent Document 1 has succeeded in decreasing the Curie temperature, such Curie temperature would pose a problem of instability and unreliability when the perovskite oxide is used in a ferroelectric device, piezoelectric device, or a power generation apparatus, as the operation temperature will rise with time. For the application to such devices and apparatuses, for example, a Curie temperature not less than 200° C. and less than 500° C. is preferable.

The present invention has been developed in view of the circumstances described above and it is an object of the present invention to provide a novel non-lead perovskite oxide which is highly stable and has excellent ferroelectricity (piezoelectricity) under a low electric field.

SUMMARY OF THE INVENTION

A perovskite oxide of the present invention is a perovskite oxide represented by General Formula (P) given below. Preferably, the perovskite oxide, in General Formula (P), satisfies Formulae (1) to (4) given below.

$$(Bi_{x1},Ba_{x2},X_{x3})(Fe_{y1},Ti_{y2},Mn_{y3})O_3 \quad (P)$$

(where, Bi and Ba are A-site elements, X is one kind or a plurality of kinds of A-site elements, other than Pb and Ba, with an average ion valence of 2. Fe, Ti, and Mn are B-site elements. O is oxygen. $0<x1+X2<1.0$, $0<x3<1.0$, $0<y1+y2<1.0$, $0\leq y3<1.0$, $0<x1$, $0<x2$, $0<y1$, $0<y2$. The standard molar ratios among A-site elements, B-site elements, and oxygen are 1:1:3, but the molar ratios among them may deviate from the standard ratios within a range in which a perovskite structure may be formed.)

$$0.6 \leq x1+X2<1.0 \quad (1)$$

$$0<x3\leq 0.4 \quad (2)$$

$$0.6 \leq y1+y2<1.0 \quad (3)$$

$$0<y3\leq 0.4 \quad (4)$$

The perovskite oxide of the present invention includes a first component and a second component respectively represented by General Formulae (P1) and (P2) given below.

$$Bi(Fe,Mn)O_3 \quad (P1)$$

$$(Ba,X)TiO_3 \quad (P2)$$

(In the first and second components, the standard molar ratios among A-site elements, B-site elements, and oxygen are 1:1:3, but the molar ratios among them may deviate from the standard ratios within a range in which a perovskite structure may be formed.) The term "major component" as used herein refers to a component with a content of not less than 80 mol %.

Preferably, the X is Ca, and where the X includes two kinds of A-site elements, it is preferable that the two kinds of A-site elements are Bi and Na or Bi and K.

According to the present invention, a perovskite oxide having a composition at or near a morphotropic phase boundary (MPB) is provided. The term "near MPB" as used herein refers to a region which transforms into another phase when an electric field is applied.

An oxide composition of the present invention is a composition that includes the perovskite oxide of the present invention. An oxide body of the present invention is a body that includes the perovskite oxide of the present invention. The oxide body of the present invention may be in the form of a film or bulk ceramic body.

According to the present invention, an oxide body having piezoelectricity may be provided. Preferably, the oxide body having piezoelectricity includes a ferroelectric phase having a crystal orientation. The term "having crystal orientation" as used herein is defined as having an orientation factor F not less than 80% measured by Lotgering method. The orientation factor F is represented by Formula (i) given below.

$$F(\%) = (P - P0)/(1 - P0) \times 100 \qquad (i)$$

where, P is the ratio between the sum of reflection intensities and the sum of total reflection intensities from the oriented face. Where (001) orientation, P is the ratio between the sum $\Sigma I(001)$ of reflection intensities I(001) from the (001) face and the sum $\Sigma I(hk1)$ of reflection intensities I(hk1) from each crystal face (hk1), that is, $\Sigma I(001)/\Sigma I(hk1)$. For example, in a perovskite crystal, if the orientation is (001), $P=I(001)/[I(001)+I(100)+I(101)+I(110)+I(111)]$. P0 corresponds to P of a sample having perfect random orientation. In perfect random orientation (P=P0), F=0%, while in perfect orientation (P=1), F=100%.

Preferably, the oxide body having piezoelectricity includes a ferroelectric phase having crystal orientation in a direction different from a spontaneous polarization axis direction of the ferroelectric phase. Preferably, the ferroelectric phase is at least one ferroelectric phase selected from the group consisting of a rhombohedral phase having crystal orientation substantially in <100> direction, a rhombohedral phase having crystal orientation substantially in <110> direction, a tetragonal phase having crystal orientation substantially in <110> direction, a tetragonal phase having crystal orientation substantially in <111> direction, an orthorhombic phase having crystal orientation substantially in <100> direction, and an orthorhombic phase having crystal orientation substantially in <111> direction. The term "having crystal orientation substantially in <abc> direction" as used herein is defined as that the orientation factor F in the direction is not less than 80%.

Preferably, the ferroelectric phase having a crystal orientation in a direction different from a spontaneous polarization axis direction has a property to transform at least in part, when an electric field is applied in a direction different from the spontaneous polarization axis direction of the ferroelectric phase, into another ferroelectric phase of different crystal system.

A piezoelectric device of the present invention is a device which includes the oxide body of the present invention and an electrode for applying an electric field to the oxide body. A liquid discharge apparatus of the present invention is an apparatus which includes the piezoelectric device of the present invention and a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the oxide body.

A power generation apparatus of the present invention is an apparatus which includes the oxide body of the present invention, a vibration plate, attached to one surface of the oxide body, for conveying external force to the oxide body to cause displacement in the oxide body, a pair of electrodes disposed to sandwich the oxide body, and an extraction electrode for extracting a charge generated in the oxide body by the displacement from the pair of electrodes.

The present inventors have found out a dopant capable of improving ferroelectricity (piezoelectricity) of a BiFeO$_3$—BaTiO$_3$ perovskite oxide without degrading the stability. Thus, the present invention may provide a novel non-lead perovskite oxide excellent in stability and ferroelectricity (piezoelectricity) under a low electric field.

DESCRIPTION OF THE PREFERRED EMBODIMENTS

[Perovskite Oxide]

A perovskite oxide of the present invention is a BiFeO$_3$—BaTiO$_3$ perovskite oxide, in which A-site includes a dopant that decreases the Curie temperature.

The present inventors have recognized that, in a Bi-containing perovskite oxide, the mobility of A-site has theoretically large influence on the piezoelectricity due to a large mass and electron orbit of Bi and high piezoelectricity can be obtained by improving the mobility of A-site. Based on the recognition, in the present invention, a dopant which may decrease the Curie temperature is doped in A-site of a perovskite oxide in order to improve the mobility of A-site while decreasing the Curie temperature, thereby obtaining a perovskite oxide having satisfactory piezoelectric properties under a low electric field.

That is, the perovskite oxide of the present invention is represented by General Formula (P) given below. Preferably, General Formula (P) satisfies Formulae (1) to (4) given below.

$$(Bi_{x1},Ba_{x2},X_{x3})(Fe_{y1},Ti_{y2},Mn_{y3})O_3 \quad (P)$$

(where, Bi and Ba are A-site elements, X is one kind or a plurality of kinds of A-site elements, other than Pb and Ba, with an average ion valence of 2. Fe, Ti, and Mn are B-site elements. O is oxygen. $0<x1+X2<1.0$, $0<x3<1.0$, $0<y1+y2<1.0$, $0\leq y3<1.0$, $0<x1$, $0<x2$, $0<y1$, $0<y2$. The standard molar ratios among A-site elements, B-site elements, and oxygen are 1:1:3, but the molar ratios among them may deviate from the standard ratios within a range in which a perovskite structure may be formed.)

$$0.6 \leq x1+X2 < 1.0 \quad (1)$$

$$0 < x3 \leq 0.4 \quad (2)$$

$$0.6 \leq y1+y2 < 1.0 \quad (3)$$

$$0 < y3 \leq 0.4 \quad (4)$$

Preferably, the perovskite oxide of the present invention includes a first component and a second component respectively represented by General Formulae (P1) and (P2) given below. It is also preferable here that the first and second components constitute a major component of the perovskite oxide of the present invention.

$$Bi(Fe,Mn)O_3 \quad (P1)$$

$$(Ba,X)TiO_3 \quad (P2)$$

(In the first and second components, the standard molar ratios among A-site elements, B-site elements, and oxygen are 1:1:3, but the molar ratios among them may deviate from the standard ratios within a range in which a perovskite structure may be formed.)

The dopant element X is an A-site element, other than Pb and Ba, with an average ion valence to two, and there is not any specific restriction on the dopant element X as long as it is capable of decreasing the Curie temperature. Ca is preferably used as a dopant element X, and a combination of Sr, Bi, and Na, a combination of Bi and K, or the like is also preferable.

Preferably, the molar ratio of the dopant x3 is $0<x3\leq0.4$ as described above. This range of the molar ratio is preferable because it allows the Curie temperature to be controlled in a desirable range according to the device and ease of manufacturing.

Present invention provides a $BiFeO_3$—$BaTiO_3$ (BF—BT) perovskite oxide with a novel composition and is excellent in the stability and ferroelectricity (piezoelectricity) under a low electric field by doping the dopant X in A-site.

There is not any specific restriction on the phase structure of the perovskite oxide of the present invention. Thus, the perovskite oxide may have a two to four phase mixed crystal structure in which components of a plurality of perovskite oxides are coexist, a single phase structure in which components of a plurality of perovskite oxides are completely solid solved, or other structures.

A-site elements, such as Bi, Pb, and the like, are highly volatile, and systems that include such elements are likely to have an A-site defect. When such A-site elements volatilize, it is often the case that volatilization occurs in the form of oxides and oxygen loss is also likely to occur at the same time. In the system of the present invention, the dopant X may compensate for the A-site defect and valence change due to oxygen loss arising from the defect, as well as decreasing the Curie temperature of the mother oxide, so that characteristic degradation is prevented, while the Curie temperature is being decreased. Consequently, the perovskite oxide of the present invention may have high ferroelectricity (piezoelectricity) under a low voltage.

Further, as described under the "Description of the Related Art", in the BF—BT system, it is known that the valence of the transition metal, Fe, which is trivalent in the chemical formula, is likely to change and a part of Fe is present as a bivalent element. As the valence change occurs in the $BiFeO_3$, oxygen loss corresponding to the bivalent Fe occurs in order to satisfy electrical neutrality, thereby causing a problem of leakage current.

The term "leakage current is likely to occur" as used herein is defined as (1) when dielectricity is not verified in bipolar polarization-electric field hysteresis measurement under the conditions of: measurement temperature=room temperature; measurement frequency=1 KHz, and application voltage E=200 kV/cm, or (2) a leakage current of $1\times10^{-2}$ A is measured in leakage current measurement (I-V measurement) with an application voltage of 200 kV/cm.

In order to improve the leakage characteristics, it is preferable to dope Mn in a B-site element, that is, $0<y3$ in General Formula (P) above. The doping of Mn may compensate for the Fe valence change and prevent leakage current.

The present inventors have also recognized a problem of high coercive electric fields Ec in the known conventional Bi perovskite oxides, such as $BiFeO_3$ and $BiAlO_3$. The present inventors have found that the coercive electric field Ec of a BF—BT system can be decreased by doping the dopant X. The decreased coercive electric field Ec allows piezoelectricity to appear from a lower electric field and, together with the effect of decreased Curie temperature, the piezoelectric properties may be improved efficiently. Thus, according to the present invention, high piezoelectricity may be obtained under a low electric field.

As described above, the present invention allows a BF—BT perovskite oxide to be highly stable and has excellent ferroelectricity (piezoelectricity). The present inventors presume that, in a case where the molar ratios of Bi and Ba are sufficiently small in comparison with that of X in A-site, the identical effect may be obtained as long as the molar ratios are within a range in which a perovskite structure may be formed. The A-site element X is an element capable of decreasing the Curie temperature of a BF—BT perovskite oxide when doped in the oxide. Accordingly, it may be presumed that the Curie temperature is decreased successfully when the ratio of the A-site element X is increased. When X component is increase, it is assumed that the ratio of Bi is relatively large in order to obtain high piezoelectric properties.

It is said that non-lead perovskite oxides, such as PZT and other known perovskite oxides, show high piezoelectricity at and near a morphotropic phase boundary (MPB). Hereinafter, it will be sometimes denoted simply as "MPB composition", in which case it refers to MPB or near MPB composition.

The present invention is not limited to MPB composition, but MPB composition is preferable because high piezoelectricity can be expected to be obtained. There is not any specific restriction on the phase structure of the perovskite oxide of the present invention. In the present invention, it is preferable that, for piezoelectric application, the phase structure of the perovskite oxide is a mixed crystal structure of a plurality of phases in which components of a plurality of perovskite oxide coexists. It is preferable that the phase structure includes at least two kinds of crystal systems. As the most stable crystal system of $BiFeO_3$ is rhombohedral, it is preferable that another type of perovskite oxide to be solid solved into $BiFeO_3$ has a crystal system other than the rhombohedral (e.g., tetragon) as the most stable crystal system. Such mixed crystal structure allows the perovskite oxide to have MPB or near MPB composition and high piezoelectricity can be expected.

The MPB composition may be designed from the relationship of ionic radii between A-site and B-site metal elements. The present inventors have filed an application for patent (Japanese Unexamined Patent Publication No. 2008-195613) related to a MBP composition design of a non-lead perovskite oxide with A-site mainly consisting Bi. For the MPB composition design, a reference is directed to the document described above. In the present invention, the relationship of ionic radii between A-site and B-site metal elements may be adjusted by the doping of dopant X, so that a large amount of freedom may be obtained in composition design and a novel MPB composition may be designed. This will lead to the creation of novel materials with remarkable performances, including high piezoelectricity and the like.

Figure 1:
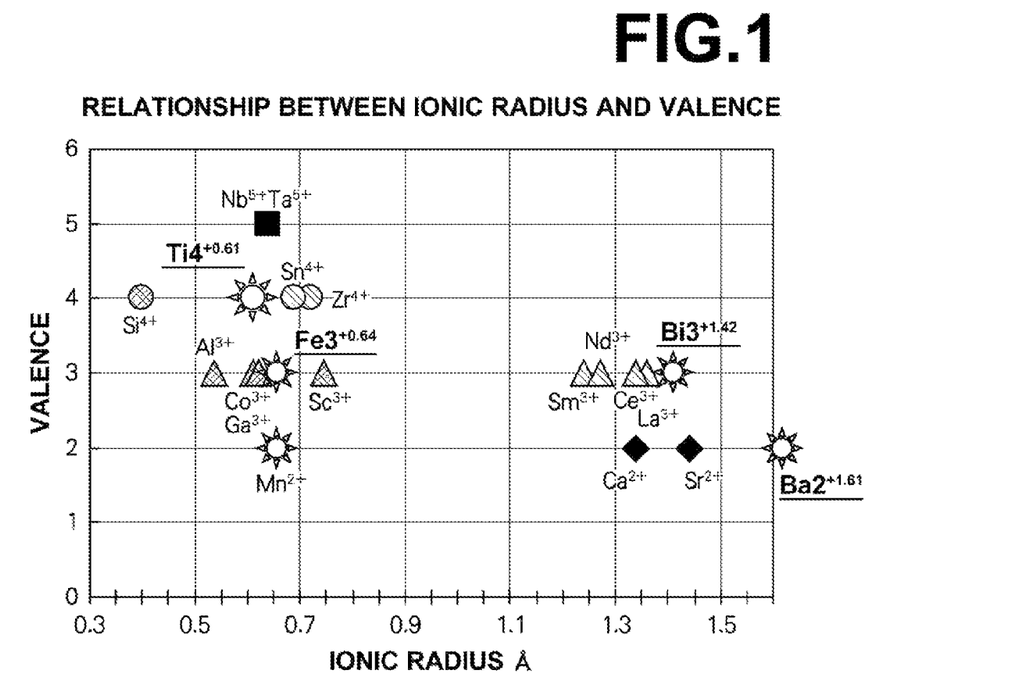
FIG. 1 illustrates ionic radii and valences of elements.

FIG. 1 illustrates example ionic radii and ion valences of elements considered to be appropriate for A-site elements and B-site elements of the perovskite oxide of the present invention. The "ionic radius" as used herein refers to a so-called Shannon ionic radius (R. D. Shannon, Acta Crystakkigr A32, 751 (1976)). The "average ionic radius" as used herein refers to a quantity represented by $\Sigma C_i R_i$ when ion mole fraction in lattice site is taken as C and ionic radius is taken as R.

How easily a dopant may enter into A-site or B-site is said to be dependent mostly on the valence and ionic radius of A-site or B-site of the mother oxide. When a dopant is doped in a plural component system, it is thought that the dopant is likely to enter into a site having an ionic radius and valence close to those of the dopant.

FIG. 1 shows that A-site elements with an average valence of two, such as Ca, (Bi, Na), and (Bi, K) are preferable as the dopant X in General Formulae (P) and (P2).

Thus, when a dopant element with an average ion valence of two is doped in A-site, the X is likely to be doped in the form of the substitution of Ba. In the mean time, (Bi, Na), and (Bi, K) has an average ion valence of two, and Bi may sometimes be doped if there is any volatilized Bi site in the mother oxide in the form of complementing the volatilized Bi.

As describe above, it is preferable that the perovskite oxide has MPB composition since high piezoelectricity can be expected from such a perovskite oxide. As described above, the present invention may provide a large amount of freedom in composition design by doping the dopant X and a novel MPB composition may be designed. This will lead to the creation of novel materials with remarkable performances, including high piezoelectricity and the like. Specific MPB design examples in the perovskite oxide of the present invention will now be described.

For example, it is presumed that the most stable crystal system of $BaTiO_3$ is tetragon, and a MPB composition or a near MPB composition may be obtained by solid solving $BiFeO_3$ and $BaTiO_3$. The present inventors assume that the MPB composition of a $BiFeO_3$—$BaTiO_3$ solid solution system is $BiFeO_3$:$BaTiO_3$ (molar ratios)=0.8:0.2 to 0.6:0.4 (depending on the shape of the perovskite oxide, such as bulk sintered body, thin film, and the like) or around there.

$BaTiO_3$ is a second component which is likely to take a perovskite structure, but is thought in theory, to have high piezoelectric properties, like $BiAlO_3$ or $BiCoO_3$. Where an oxide which is not likely to take a perovskite structure is used as the second component, the present invention allows a MPB composition design in which the amount of $BiAlO_3$ or $BiCoO_3$, which is inherently unlikely to take a perovskite structure with Bi, is reduced by doping the dopant X and/or dopant Y. Reduction in the amount of $BiAlO_3$ or $BiCoO_3$, which is inherently unlikely to take a perovskite structure with Bi, implies that a perovskite structure is more likely to be obtained.

As described above, the present invention is a $BiFeO_3$—$BaTiO_3$ perovskite oxide, in which a dopant X capable of decreasing the Curie temperature is doped in A-site. In the present invention, Mn doped structure may provide sufficient prevention effect of leakage current due to Fe valence change, and ferroelectricity (piezoelectricity) is exhibited effectively. The present invention may decrease the Curie temperature by the dopant X to the extent in which the stability is not affected.

Further, present invention may decrease the coercive electric field Ec by the dopant X. The decreased coercive electric field Ec allows piezoelectricity to appear from a lower electric field and, together with the effect of decreased Curie temperature, the piezoelectricity appears from a low electric field, thereby leading to high piezoelectric properties. The present invention allows a novel MPB composition design to be made. According to the present invention, an eco-friendly non-lead perovskite oxide may be provided.

[Oxide Composition]

An oxide composition of the present invention includes the perovskite oxide of the present invention described above. The oxide composition of the present invention may include any component other than the perovskite oxide of the present invention, such as a perovskite oxide other than the perovskite oxide of the present invention, other oxides, various types of additive elements, and a sintering agent.

[Oxide Body (Piezoelectric Body, Ferroelectric Body)]

An oxide body of the present invention includes the perovskite oxide of the present invention described above. The oxide body may be formed into various designs, including film, bulk ceramic body, or single crystal design.

According to the present invention, an oxide body having piezoelectricity (piezoelectric body of film design, bulk ceramic design, or the like) may be provided. The piezoelectric body of the present invention is preferably applied to actuators or the like mounted on inkjet recording heads, magnetic read/write heads, MEMS (micro electro-mechanical systems) devices, micropumps, ultrasonic probes, and the like.

According to the present invention, an oxide body having ferroelectricity (ferroelectric body of film design, bulk ceramic design, or the like) may be provided. The ferroelectric body of the present invention is preferably applied to ferroelectric devices, such as a ferroelectric memory (FeRAM) and the like.

Hereinafter, a piezoelectric body of the present invention will be described. Preferably, the piezoelectric body of the present invention contains a ferroelectric phase having crystal orientation. Piezoelectric strains may include the following, but not limited to:

(1) ordinary piezoelectric strain in which expansion or contraction occurs in a direction of applied electric field when the vector component of spontaneous polarization axis corresponds to the direction of applied electric field according to the increase or decrease in applied electric field intensity (electric-field induced strain);

(2) piezoelectric strain produced by increasing or decreasing the electric field intensity and reversibly rotating the polarization axis by non-180°;

(3) piezoelectric strain caused by the change in volume due to crystal phase transitions induced by increasing or decreasing the electric field intensity; and (4) piezoelectric strain that makes use of engineered domain effect, which is capable of providing a larger strain, obtained by using a material having a property to cause phase transitions by the application of an electric field and forming a crystal orientation structure having a ferroelectric phase with a crystal orientation in a direction different from the spontaneous polarization direction (when making use of the engineered domain effect, the piezoelectric body may be driven under the condition in which phase transitions occur or under the condition in which phase transitions do not occur).

The piezoelectric strain (2) that makes use of reversible rotation of non-180° is described, for example, in Japanese Unexamined Patent Publication No. 2004-363557. The piezoelectric strain (3) that makes use of phase transitions is described, for example, in Japanese Patent No. 3568107. The piezoelectric strain (4) that makes use electric field induced phase transitions and engineered domain effect is described, for example, in "Ultrahigh strain and piezoelectric behavior in relaxor based ferroelectric single crystals" by S. E. park, et al., JAP, 82, 1804 (1997) and Japanese Unexamined Patent Publication No. 2007-116091 filed by the present inventors.

The use of the piezoelectric strains (1) to (4) individually or in combination allows a desired piezoelectric strain to be obtained. In each of the piezoelectric strains (1) to (4), a larger piezoelectric strain may be obtained by forming a crystal orientation structure according to the strain generation mechanism. The piezoelectric body of the present invention may include, for example, a ferroelectric phase of (100) orientation and/or (111) orientation.

Where the piezoelectric strains (2) to (4) are used individually or in combination, it is preferable that the piezoelectric body of the present invention includes a ferroelectric phase having crystal orientation in a direction different from the spontaneous polarization axis direction. For example, in a system of the piezoelectric strain (4), it is preferable that the ferroelectric phase in which phase transitions occur has crystal orientation in a direction different from the spontaneous polarization axis direction, and it is more preferable that it has crystal orientation in a direction substantially corresponding to the spontaneous polarization axis direction after phase transition. Normally, the crystal orientation direction corresponds to the electric field application direction.

The spontaneous polarization axes of ferroelectric bodies are as follows: tetragonal system: <001>, orthorhombic system: <110>, and rhombohedral system: <111>. Preferably, the ferroelectric phase having crystal orientation in a direction different from the spontaneous polarization axis direction is at least one ferroelectric phase selected from the group consisting of a rhombohedral phase having crystal orientation substantially in <100> direction, rhombohedral phase having crystal orientation substantially in <110> direction, a tetragonal phase having crystal orientation substantially in <110> direction, a tetragonal phase having crystal orientation substantially in <111> direction, an orthorhombic phase having crystal orientation substantially in <100> direction, and an orthorhombic phase having crystal orientation substantially in <111> direction.

Preferably, the ferroelectric phase having crystal orientation in a direction different from the spontaneous polarization axis direction is a ferroelectric phase having a property to make phase transition at least in part when an electric filed is applied in a direction different from the spontaneous polarization axis direction of the ferroelectric phase.

In the electric field induced phase transition system described above, a volume change occurs by the change in crystal structure due to phase transitions, whereby a large amount of strain displacement may be obtained. Application of electric field in a direction substantially corresponding to the spontaneous polarization axis direction after phase transition is preferable to application of electric field in the spontaneous polarization axis direction before phase transition in that it may provide a larger amount of strain displacement by the engineered domain effect prior to phase transition.

Application of electric field in a direction substantially corresponding to the spontaneous polarization axis direction after phase transition causes phase transitions to occur more easily. The reason may be that the crystal structure is more stable when the spontaneous polarization direction is matched with the electric application direction and phase transitions occur easily to the more stable crystal system. There may be a case in which some of ferroelectric phases remain as they are without making phase transitions even when an electric field sufficient to complete phase transitions, but this may cause phase transitions to occur effectively so that the ratio of ferroelectric phases remaining without making phase transitions may be reduced when an electric field sufficient to complete phase transitions is applied. As a result, a larger amount of strain displacement may be obtained than that when the electric field is applied in the spontaneous axis direction before phase transition. Further, after phase transition, the application direction of electric field substantially matches with the spontaneous polarization axis direction, so that the piezoelectric effect of the ferroelectric phases after phase transition appears effectively and a large amount of strain displacement may be obtained stably.

As described above, when the application direction of electric field is substantially matched with the spontaneous polarization axis direction after phase transition, a large amount of strain displacement may be obtained before, during, and after phase transition. This effect may be obtained when at least the spontaneous polarization axis direction before phase transition differs from the application direction of electric field, and appears more significantly if the application direction of electric field is close to the spontaneous polarization axis direction after phase transition.

As for the piezoelectric body that includes ferroelectric phases having crystal orientation, an oriented film (one axis oriented film), an epitaxial film (three axis oriented film), and a grain oriented sintered ceramics body may be cited.

The oriented film may be obtained by performing film forming under a condition in which one axis oriented crystal structure is formed using any of known thin film forming methods, such as gas phase methods, including sputtering, MOCVD, plasma CVD, PLD (pulse laser deposition), and the like, or liquid phase methods, including sol gel method, metal organic decomposition, and the like. The epitaxial film may be formed using materials having a good lattice matching with a piezoelectric film for the substrate and lower electrode. As for the preferable combination of substrate/lower electrode, $SrTiO_3$/$SrRuO_3$, MgO/Pt, or the like may be cited. The grain oriented sintered ceramics body may be formed by hot-press method, sheet method, lamination press method in which a plurality of sheets obtained by sheet method is laminated and pressed, or the like.

[Example Film Forming System and Method]

Figure 2:
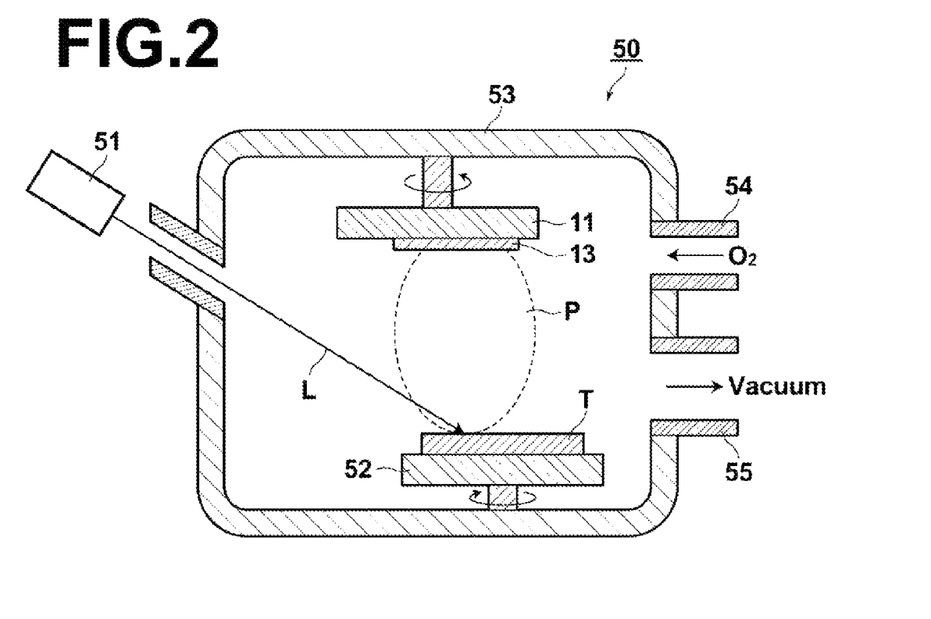
FIG. 2 is a schematic view of a pulsed laser deposition system, illustrating the structure thereof.

An example film forming system and method for forming the perovskite oxide film of the present invention will be described with reference to FIG. 2. There is not any specific restriction of the method of forming the perovskite oxide film of the present invention. Here, epitaxial film forming by PLD method will be described as an example.

In the PLD method, when target T placed on rotatable target holder 52 is irradiated with laser light L emitted from pulse laser 51, plasma (plume P) is generated in a direction substantially perpendicular to the surface of target T, and a component of target T is turned into a plasma or molecular state and reaches substrate 11. Then, crystal nucleation and crystal growth occurs on substrate 11 while migrating with respect to each laser pulse and crystal growth is obtained by repeating this process. If film 13 to be formed is an oxide film, it is necessary to make the inside of vacuum chamber 53 a low-oxygen partial pressure atmosphere by oxygen introducing section 54 and pressure reducing section 55. That is, film properties and crystal structure to be obtained vary with the plasma state and oxygen partial pressure.

There is not any specific restriction on the substrate on which the perovskite oxide film of the present invention is formed, and it is preferable to select a material having a good lattice matching with the film to be formed. The use of a substrate having lattice matching for epitaxial growth allows a perovskite oxide epitaxial film having identical crystal orientation to that of the substrate to be formed.

For example, in a case where a perovskite oxide film (P) is formed on a substrate in the form in which (001) face of the perovskite oxide film (P) is lattice matched with face (001) of the substrate, and the lattice constant of the substrate and that of the perovskite oxide film (P) are taken as Cs and C respectively, it is preferable to select a material that satisfies nCs/mC (n, m=1 to 5) falls within the range from 0.95 to 1.05.

As for the substrate having a good lattice matching with Bi oxide and allows epitaxial film forming, a perovskite single crystal substrate is preferable. As for the perovskite single crystal substrate, $SrTiO_3$, $NdGaO_3$, or $LaAlO_3$ substrate may be cited. A lattice matched buffer layer and lower electrode may be provided on the substrate.

Where the substrate is other than the perovskite single crystal substrate, Si or MgO substrate may be cited, and it is preferable that the substrate is provided with a buffer layer or the like that allows epitaxial growth. Such combinations of substrate and buffer layer or the like include $Pt/Ti/SiO_2/Si$, $SrRuO_3/MgO/Si$, $SrRuO_3/YSZ/CeO_2/Si$, $SrRuO_3/MgO$, and the like.

The present inventors assume that a Bi system compound has a high vapor pressure and tends to volatilize easily so that bismuth oxide volatilization influences the crystal growth, thereby making difficult to take a perovskite structure. In particular, when a Bi perovskite oxide film is formed on a Si substrate through an electrode material having a low gas barrier property, such as Pt/Ti electrode, it is conceivable that volatilized bismuth oxide reaches the Si substrate and reacts with Si, whereby the crystal growth is likely to be affected.

Further, as described above, the atoms and molecules reached the substrate 11 repeat crystal nucleation and crystal growth with respect to each laser pulse while migrating on the substrate. Accordingly, an excessively high laser pulse frequency may cause that, before a migrated atom takes a perovskite structure, a next atom arrives and accumulates, thereby forming a different phase. On the other hand, an excessively low laser pulse frequency may result in a low film forming speed and a desired film thickness may not be ensured. In particular, it is thought that when the amount of Fe, which is likely to take a perovskite structure with Bi, is reduced, a different phase is more likely to be formed.

In the PLD method, for example, by preventing the volatilization of Bi system compound through the optimization of oxygen partial pressure, and optimizing the plasma state by controlling the laser pulse frequency, the ratio of different phases may be decreased and a perovskite oxide film that includes the perovskite oxide (P) of the present invention may be formed.

[Piezoelectric Device (Ferroelectric Device) and Inkjet Recording Head]

Figure 3:
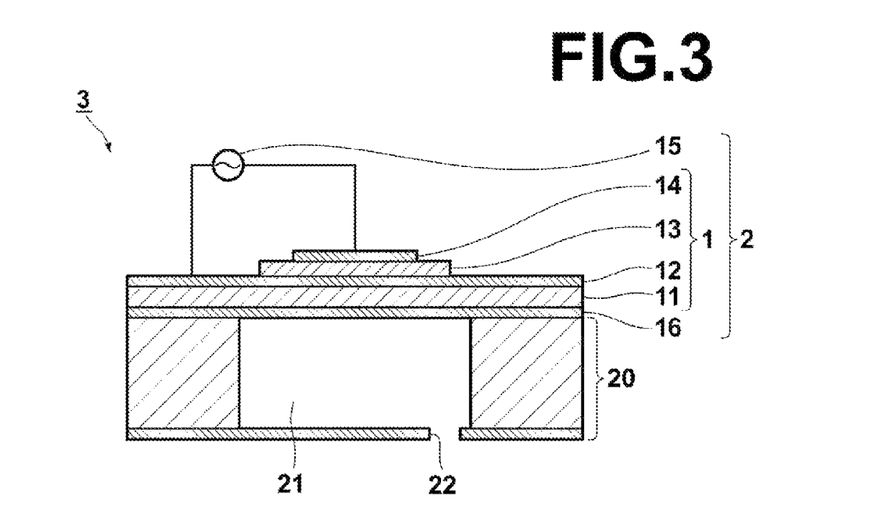
FIG. 3 is a view of a relevant part of an inkjet recording head (liquid discharge apparatus) using a piezoelectric device according to an embodiment of the present invention, illustrating the structure thereof.

The structure of a piezoelectric device according to an embodiment of the present invention and an inkjet recording head (liquid discharge device) having the piezoelectric device will be described with reference to the accompanying drawings. FIG. 3 is a cross-sectional view (cross-sectional view in the thickness direction of the piezoelectric device) of a relevant part of the inkjet recording head. Each of the components is not necessarily drawn to scale for facilitating visual observation.

Piezoelectric device 1 shown in FIG. 3 is a device which includes lower electrode 12, piezoelectric film (ferroelectric film) 13, and upper electrode 14 stacked on substrate 11 in this order. Piezoelectric film 13 is a perovskite oxide film that includes the perovskite oxide (P) of the present invention, and an electric field is applied in the thickness direction by upper electrode 14 and lower electrode 12.

There is not any specific restriction on substrate 11, and a substrate that lattice matches well with the perovskite oxide film is preferably used. There is not any specific restriction on lower electrode 12 and is preferable to be an epitaxial film formed on substrate 11 by epitaxial growth and allows epitaxial growth of piezoelectric film 13. There is not any specific restriction on the major component of upper electrode 14 and, a metal, such as Au, Pt, Ir, $IrO_2$, $RuO_2$, $LaNiO_3$, or $SrRuO_3$, a metal oxide, or a combination thereof may be used. Further, an electrode material generally used for semiconductor processing, such as Al, Ta, Cr, or Cu may be used.

There is not any specific restriction on the thicknesses of lower electrode 12 and upper electrode 14 and are preferable to be in the range from 50 nm to 500 nm. There is not any specific restriction on the thickness of piezoelectric film 13 and is preferable to be in the range from 500 nm to several tens of micrometers.

Piezoelectric actuator 2 includes piezoelectric device 1 and vibration plate 16, which vibrates according to stretching/contraction of piezoelectric film 13, attached to the lower surface of substrate 11 of piezoelectric device 1. Piezoelectric actuator 2 further includes control unit 15, such as a drive circuit or the like, for drive controlling piezoelectric device 1. Inkjet recording head (liquid discharge apparatus) 3 is an apparatus basically constituted by piezoelectric actuator 2 and an ink nozzle (liquid storage/discharge member) 20, having an ink storage chamber (liquid storage chamber) 21 for storing an ink and an ink discharge opening (liquid discharge opening) 22 for discharging the ink from ink storage chamber 21 to the outside, attached to the bottom surface of piezoelectric actuator 2. In inkjet recording head 3, piezoelectric device 1 is stretched or contracted by increasing or decreasing the electric field applied to piezoelectric device 1 to control the ink discharge and discharge amount from ink storage chamber 21.

Instead of attaching vibration plate 16 and ink nozzle 20 made of separate members to substrate 11, portions of substrate 11 may be formed into vibration plate 16 and ink nozzle 20. For example, where substrate 11 is a laminated substrate, such as a SOI substrate, ink storage chamber 21 may be formed by etching substrate 11 from the bottom side, and vibration plate 16 and ink nozzle 20 may be formed by processing the substrate itself.

Piezoelectric device 1 includes piezoelectric film 13 that includes the perovskite oxide (P) of the present invention described above, and according to the present embodiment, piezoelectric device 1 with excellent piezoelectricity may be provided.

[Inkjet Recorder]

Figure 4:
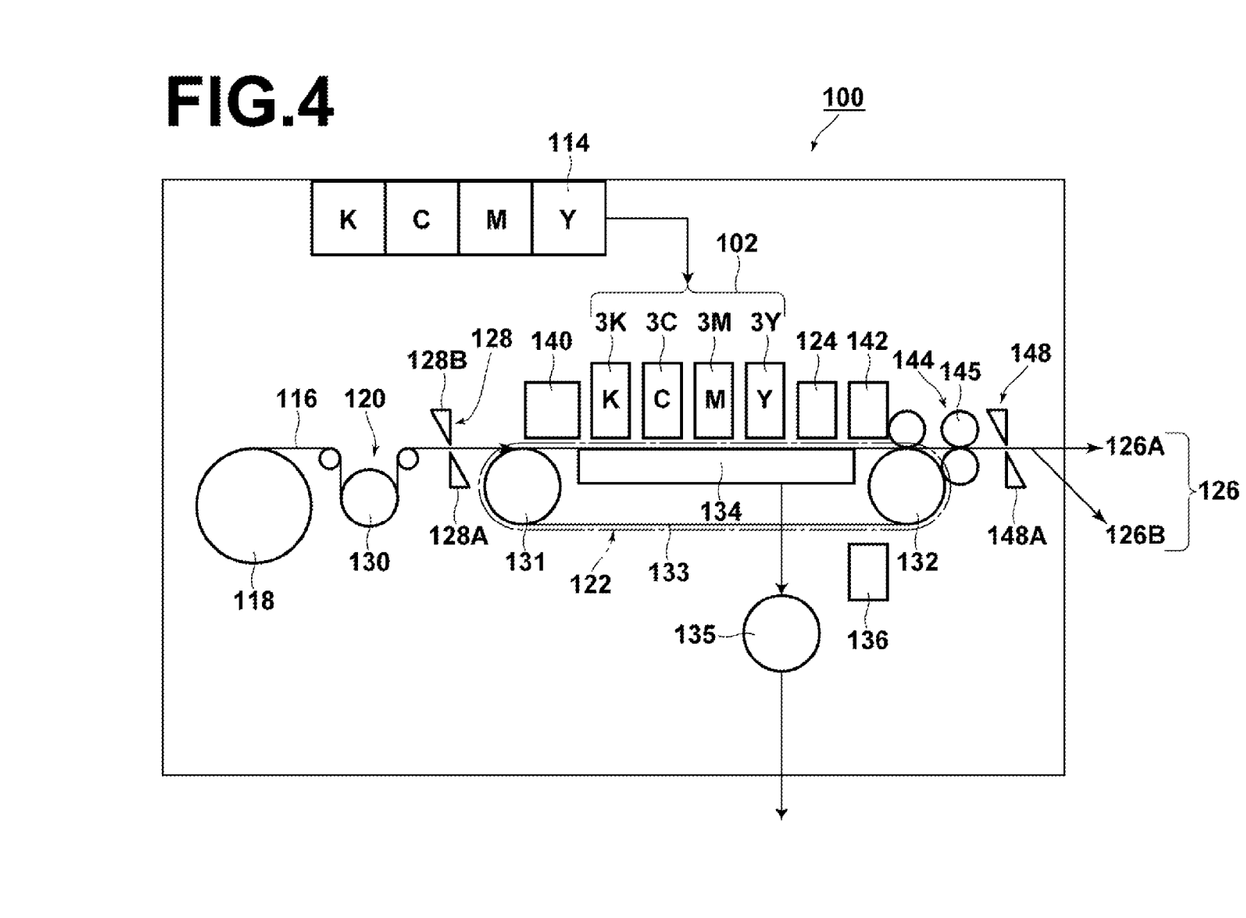
FIG. 4 illustrate an example configuration of an inkjet recording apparatus having the inkjet recording head of FIG. 2.
Figure 5:
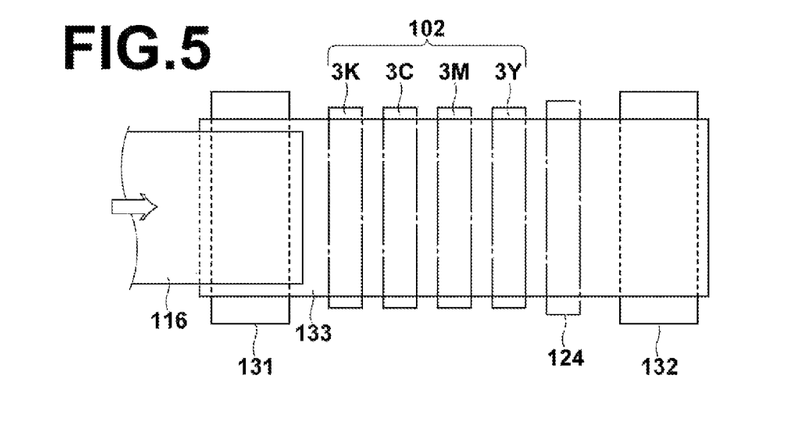
FIG. 5 is a partial top view of the inkjet recording apparatus of FIG. 3.

An example configuration of an inkjet recorder having an inkjet recording head 3 according to the embodiment described above will be described with reference to FIGS. 4 and 5. FIG. 4 is an overall view and FIG. 5 is a partial top view of the recorder.

Illustrated inkjet recorder 100 basically includes print section 102 having a plurality of inkjet recording heads (hereinafter, simply "heads") 3K, 3C, 3M, and 3Y, each for each ink color, ink storage/mount section 114 for storing inks to be supplied to each of heads 3K, 3C, 3M, and 3Y, paper feed section 118 for feeding recording paper 116, decurling section 120 for decurling recording paper 116, suction belt conveyor 122, disposed opposite to the nozzle surface (discharge surface) of print section 102, for conveying recording paper 116 while maintaining flatness of recording paper 116, print detection section 124 for reading a result of printing performed by print section 102, and paper discharge section 126 for discharging a printed paper (printed material) to the outside. Each of Heads 3K, 3C, 3M, and 3Y constituting print section 102 corresponds to inkjet recording head 3 according to the embodiment described above.

In decurling section 120, recording paper 116 is decurled by heating with heating drum 130 in the direction opposite to the curled direction of recording paper 116 wound on a roll. For the recorder that uses a roll paper, cutter 128 for cutting the roll paper is provided at a latter stage of decurling section 120, as illustrated in FIG. 4, and the roll paper is cut out to a desired size. Cutter 128 includes fixed blade 128A having a length greater than the width of the conveyor path and round blade 128B that moves along fixed blade 128A, in which fixed blade 128A is provided on the rear side of the printing surface and round blade 128B is provided on the printing surface side across the conveyor path. The recorder that uses a cut sheet does not require cutter 128.

Decurled and cutout recording paper 116 is fed to suction belt conveyor 122. Suction belt conveyor 122 includes rollers 131, 132, and endless belt 133 wound between them, and configured such that at least the portion opposite to the nozzle surface of print section 102 and the sensor surface of print detection section 124 becomes a level plane (flat plane).

Belt 133 has a width greater than that of recording paper 116 and many suction holes (not shown) are formed in the belt face. Suction chamber 134 is provided at the position opposite to the nozzle surface of print section 102 and the sensor surface of print detection section 124 in the inner side of belt 133 wound between rollers 131, 132. Suction chamber 134 is suctioned by fan 135 so as to have a negative pressure, thereby suction-holding recording paper 116 on belt 133.

Power is supplied to at least either one of rollers 131, 132 from a motor (not shown), whereby belt 133 is driven in clockwise direction in FIG. 4 and recording paper 116 held on belt 133 is conveyed from left to right in FIG. 4.

When a borderless print or the like is printed, the ink adheres also to belt 133, so that belt cleaning section 136 is provided at a predetermined position (appropriate position other than the printing area) on the outer side of belt 133.

Heating fan 140 is provided on the upstream side of print section 102 on the paper conveyer path formed by suction belt conveyor 122. Heating fan 140 blows heated air onto recording paper 116 before printing to heat recording paper 116. By heating recording paper 116 immediately preceding the printing, spotted inks on recording paper 116 are dried faster.

Print section 102 is a so-called full line head in which line heads having a length corresponding to a maximum paper width are disposed in a direction (main scanning direction) orthogonal to the paper feed direction (FIG. 5). Each of printing heads 3K, 3C, 3M, and 3Y is a line head having a plurality of ink discharge openings (nozzles) disposed over a length which exceeds at least one side of maximum size of recording paper 116 to be printed by inkjet recorder 100.

Heads 3K, 3C, 3M, and 3Y corresponding to black (K), cyan (C), magenta (M), and yellow (Y) are disposed in this order from the upstream side along the paper feed direction of recording paper 116. A color image is recorded on recording paper 116 while being conveyed by discharging a color ink from each of heads 3K, 3C, 3M, and 3Y.

Print detection section 124 is constituted by a line sensor or the like for imaging inkjet results of print section 102 to detect an inkjet fault, such as clogging of a nozzle, from the obtained inkjet image. Post drying section 142 constituted by a heating fan or the like for drying the printed image surface is provided at the latter stage of print detection section 124. It is desirable that the printed surface avoids any contact until the inks are dried, so that a method of blowing heated air is preferable.

Heating/pressing section 144 for controlling the glossiness of an image surface is provided at the latter stage of post drying section 142. In heating/pressing section 144, the image surface is pressed, while being heated, by pressing rollers 145 having a predetermined uneven surface shape to transfer the uneven shape to the image surface.

The printed material obtained in the manner described above is discharged from paper discharge section 126. Preferably, an intended print (print on which an intended image is printed) and a test print are discharged separately. Inkjet recorder 100 includes a selection means (not shown) for selecting and switching paper discharge paths between intended prints and test prints to send them discharge section 126A and 126B respectively. Where an intended image and a test image are printed on a large paper in parallel at the same time, cutter 148 may be provided to separate the test print portion. Inkjet recorder 100 is structured in the manner as described above.

[Power Generator]

Figure 6A:
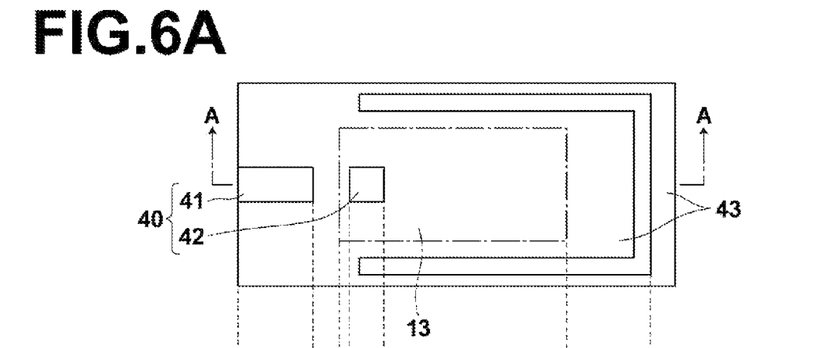
FIG. 6 is a schematic view of a power generator of the present invention, illustrating the structure thereof.
Figure 6B:
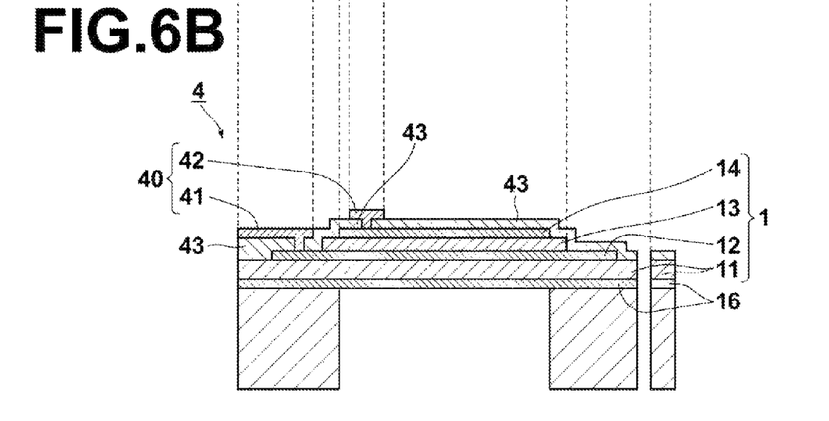

A piezoelectric device according to an embodiment of the present invention and a power generator having the piezoelectric device will be described with reference to the accompanying drawings. A of FIG. 6 is a top view of the power generator and B of FIG. 6 is a cross-sectional view (cross-sectional view in the thickness direction of the piezoelectric device) of a relevant part of the power generator. Each of the components is not necessarily drawn to scale for facilitating visual observation.

Power generator 4 shown in B of FIG. 6 includes vibration plate 16, attached to the rear surface of piezoelectric device 1, for conveying external force to piezoelectric body 13 to displace the body 13 and extraction electrode 40 (41, 42) for extracting a charge generated in piezoelectric body 13 by the displacement from the electrodes (lower electrode 12 and upper electrode 14) to the outside. In the present embodiment, piezoelectric device 1 is supported in a cantilever fashion (A of FIG. 6) and the supported end portion is connected to a generation source for generating an external force (not shown). The surface (upper face) of power generator 4 is covered by insulating protection film 43, such as $SiO_2$ or the like, other than the surface of extraction electrode 40. The cantilever supporting is preferable since it allows piezoelectric body 13 to be displaced largely when an external force is applied.

When piezoelectric body 13 is displaced by receiving an external force, tensile stress and compressive stress occur in piezoelectric device 1. As piezoelectric body 13 is fixed to vibration plate 16, the fixed surface is unable to expand or contract and the stresses described above are applied to piezoelectric body 13, whereby charges are generated on lower electrode 12 and upper electrode 14.

There is not any specific restriction on vibration plate 16 as long as it has high elasticity and various materials may be used, including resins, metals, ceramics, and the like. Materials having high corrosion resistance and high elasticity, such as stainless steel and phosphor bronze, are particularly preferable.

There is not any specific restriction on extraction electrode 40 and a highly conductive metal electrode, such as Au or the like, is preferably used.

Where an SOI substrate is used as substrate 11, power generator 4 may be manufactured by forming lower electrode 12, piezoelectric body 13, and upper electrode 14, then forming a cantilever support having vibration plate 16 by etching a part of the substrate from the bottom side, as in inkjet recording head 3, forming protection film 43 and extraction electrode 40, and finally performing dry etch processing.

(Design Change)

The present invention is not limited to the embodiments described above, and may be changed in design without departing from the sprit of the present invention.

EXAMPLES

Examples of the present invention and Comparative Examples will now be described.

Example 1, Comparative Example 1

In each example, a (100) $SrRuO_3$ lower electrode was formed on the surface of a (100) $SrTiO_3$ single crystal substrate by PLD method with a thickness of 0.2 μm. Then, a perovskite oxide film was formed by PLD method under the following film forming conditions. In each example, the film forming was performed under the same conditions other than the composition of the target.

Target Compositions and Film Compositions:

| | |
|---|---|
| Target Composition of Example 1: | $Bi_{1.1}FeO_3:Bi_{1.1}MnO_3:BaTiO_3:CaTiO_3 =$ 0.68:0.04:0.18:0.10 |
| Film Composition of Example 1: | $(Bi_{0.72},Ba_{0.18},Ca_{0.10})(Fe_{0.68},Ti_{0.28},Mn_{0.04})O_3$ |
| Target Composition of Comparative Example 1: | $Bi_{1.1}FeO_3:Bi_{1.1}MnO_3:BaTiO_3 =$ 0.76:0.04:0.20 |
| Film Composition of Comparative Example 1: | $(Bi_{0.80},Ba_{0.20})(Fe_{0.76},Ti_{0.20},Mn_{0.04})O_3$ |

Figure 7:
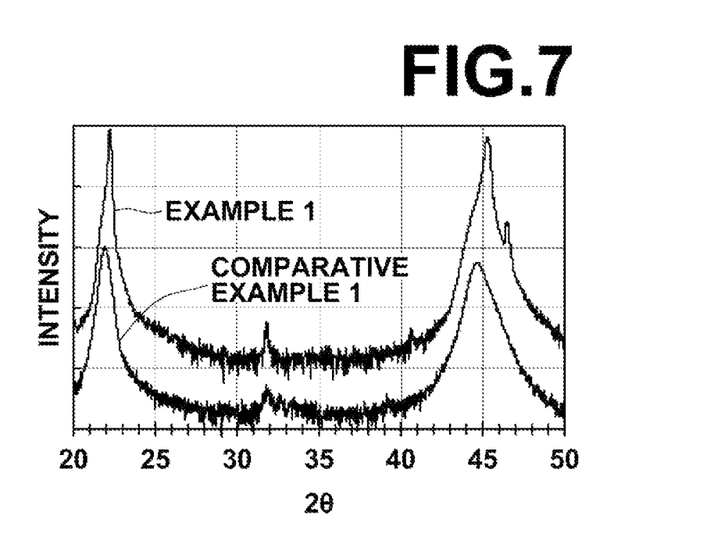
FIG. 7 illustrates XRD spectra of piezoelectric films of Example 1 and Comparative Example 1.

Film Forming Conditions Common to Example 1 and Comparative Example 1
  SRO/STO Substrate
  Laser Power: 200 mJ
  Laser Pulse Frequency: 5 Hz
  Oxygen Partial Pressure: 6.66 Pa (50 mm Torr)
  Distance between Substrate and Target: 50 mm
  Target Revolutions: 9.7 rpm
  Substrate Temperature: 580° C.
  Film Forming Time: 240 mins
  Film Thickness: 1100 nm
  X-ray analysis (XRD) measurement results performed on the obtained films are shown in FIG. 7. As shown in FIG. 7, each film was a perovskite single phase film with (100) preferred orientation. Then, a Pt upper electrode was formed on each perovskite film with a thickness of 150 nm by sputtering to obtain piezoelectric devices of Example 1 and Comparative Example 1.

Amounts of displacement of the tip of the piezoelectric device obtained in each of Example 1 and Comparative Example 1 were measured by applying voltages of 30V and 100V using a cantilever (15 mm×25 mm with a film thickness of 0.5 mm). Further, the relative dielectric constant of each example was measured. Using "Impedance Analyzer 4294A" available from Agilent Technologies Inc., the capacitance of each example was measured in Cp-D mode by varying the frequency in the range from 1 kHz to 1 MHz, and the relative dielectric constant was calculated from the film thickness and electrode area.

The results of piezoelectric property (amounts of displacement) and relative dielectric constant measurements are shown in Table 1. For the dielectric constants, the dielectric constant at 1 KHz of each example is shown as the representative. As shown in Table 1, it has been verified that the amount of displacement of Ca doped Example 1 at the low electric field (30 V) is 1.5 times as large as that of non-doped Comparative Example 1.

TABLE 1

| | | AMOUNT OF DISPLACEMENT (nm) | |
|---|---|---|---|
| | RELATIVE DIELECTRIC CONSTANT | APPLIED VOLTAGE (30 V) | APPLIED VOLTAGE (100 V) |
| EXAMPLE 1 | 230 | 1.6 | 6.0 |
| COMPARATIVE EXAMPLE 1 | 195 | 1.1 | 5.9 |

Figure 8:
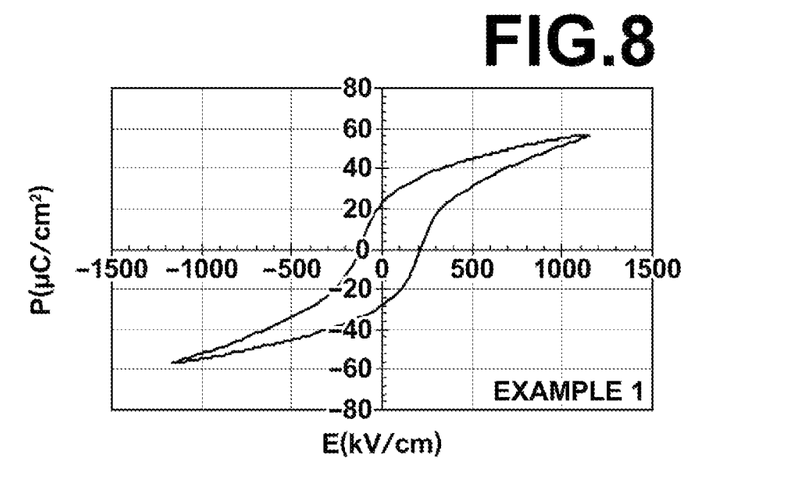
FIG. 8 illustrates hysteresis characteristics of a piezoelectric device of Example 1.
Figure 9:
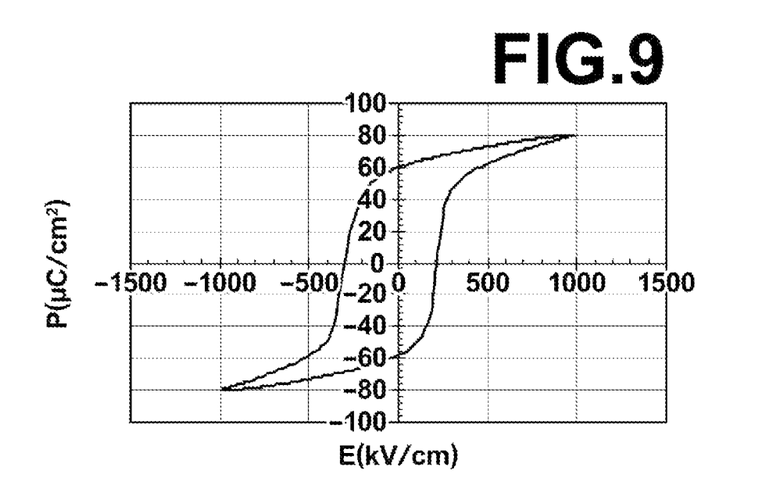
FIG. 9 illustrates hysteresis characteristics of a piezoelectric device of Comparative Example 1.

With respect to each example, bipolar polarization-electric field characteristics (PE hysteresis characteristics) were measured at room temperature (about 25° C.) by applying an electric field to the perovskite oxide film. The measurement frequency was set to 1 kHz. Measurement results of Example 1 and Comparative Example 2 are shown in FIGS. 8 and 9 respectively. FIG. 8 shows that the coercive electric field 2Ec=|Ec+|+|Ec−| is decreased in comparison with FIG. 9. This implies that ferroelectricity (piezoelectricity) appears from a lower electric field.

The piezoelectric oxide of the present invention is preferably applied to actuators mounted on inkjet recording heads, magnetic read/write heads, MEMS (micro electro-mechanical systems) devices, micropumps, ultrasonic probes, and the like, and as vibration generators or vibration monitoring devices used by installing in floors, shoes, tires, and the like.

What is claimed is:

1. A perovskite oxide represented by General Formula (P) given below, $$(Bi_{x1},Ba_{x2},X_{x3})(Fe_{y1},Ti_{y2},Mn_{y3})O_3 \quad (P)$$

wherein, Bi and Ba are A-site elements, X is one or a plurality of A-site elements, other than Pb and Ba, with an average ion valence of 2;
Fe, Ti, and Mn are B-site elements;
O is oxygen;
0<x1+x2<1.0, 0<x3<1.0, 0<y1+y2<1.0, 0<y3<1.0, 0<x1, 0<x2, 0<y1, 0<y2;
the standard molar ratios among A-site elements, B-site elements, and oxygen are 1:1:3, and the standard molar ratios among them can deviate from the standard molar ratios within a range which is capable of forming a perovskite structure.

2. The perovskite oxide of claim 1, wherein the perovskite oxide, in General Formula (P), satisfies Formulae (1) to (4) given below, $$0.6 \leq x1+x2 < 1.0 \quad (1)$$

$$0 < x3 \leq 0.4 \quad (2)$$

$$0.6 \leq y1+y2 < 1.0 \quad (3)$$

$$0 < y3 \leq 0.4 \quad (4).$$

3. The perovskite oxide of claim 1, wherein the perovskite oxide includes a first component and a second component respectively represented by General Formulae (P1) and (P2) given below, $$Bi(Fe,Mn)O_3 \quad (P1)$$

$$(Ba,X)TiO_3 \quad (P2)$$

in the first and second components, the standard molar ratios among A-site elements, B-site elements, and oxygen are 1:1:3, and the standard molar ratios among them can deviate from the standard molar ratios within a range which is capable of forming a perovskite structure.

4. The perovskite oxide of claim 1, wherein X is Ca.

5. The perovskite oxide of claim 1, wherein X includes A-site elements and the A-site elements are Bi and Na or Bi and K.

6. The perovskite oxide of claim 1, wherein the perovskite oxide has a composition at or near a morphotropic phase boundary.

* * * * *